United States Patent
Bader

(10) Patent No.: US 11,055,596 B2
(45) Date of Patent: Jul. 6, 2021

(54) METHOD OF FASTENING AND ELECTROCONDUCTIVE CONNECTING A CHIP MODULE TO A CHIP CARD

(71) Applicant: GIESECKE+DEVRIENT MOBILE SECURITY GMBH, Munich (DE)

(72) Inventor: Johannes Bader, Oberau (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 0 days.

(21) Appl. No.: 16/750,749

(22) Filed: Jan. 23, 2020

(65) Prior Publication Data

US 2020/0160138 A1 May 21, 2020

Related U.S. Application Data

(63) Continuation of application No. 13/515,306, filed as application No. PCT/EP2010/007580 on Dec. 13, 2010, now abandoned.

(30) Foreign Application Priority Data

Dec. 16, 2009 (DE) .......................... 102009058435.8

(51) Int. Cl.
 *G06K 19/077* (2006.01)
(52) U.S. Cl.
 CPC ... *G06K 19/07749* (2013.01); *G06K 19/0775* (2013.01); *H01L 2224/16225* (2013.01);
 (Continued)

(58) Field of Classification Search
 CPC ............ H05K 7/02; H05K 7/06; H05K 13/04; H05K 1/11; H05K 1/14; H05K 1/18;
 (Continued)

(56) References Cited

U.S. PATENT DOCUMENTS 5,519,201 A * 5/1996 Templeton, Jr. ............................ G06K 19/07745
235/492
5,651,179 A * 7/1997 Bessho ................. H01L 21/563
257/E21.503

(Continued)

FOREIGN PATENT DOCUMENTS

| CN | 1169197 A | 12/1997 |
| CN | 1820361 A | 8/2008 |

(Continued)

OTHER PUBLICATIONS

International Search Report for PCT/EP2010/007580, dated Mar. 22, 2011.

(Continued)

*Primary Examiner* — Tuan T Dinh
(74) *Attorney, Agent, or Firm* — Workman Nydegger

(57) ABSTRACT

A method for manufacturing a chip card is provided by electroconductive connecting of a chip module to a chip-card body having at least one electrical contact area. The method includes adhesively connecting the chip module to the chip-card body by a thermoplastic, electroconductive elastomeric material such that the chip module is conductively connected to at least one electrical contact area of the chip-card body.

19 Claims, 2 Drawing Sheets

(52) U.S. Cl.
CPC ............... *H01L 2224/16227* (2013.01); *H01L 2924/00014* (2013.01)

(58) Field of Classification Search
CPC .... H05K 1/141–144; H05K 1/181–188; H01L 2224/16225–16227; G06K 19/077; G06K 19/07749; G06K 19/0775
USPC ........ 361/736–737, 807–810, 816, 818, 760, 361/764, 767, 803; 235/487–492; 174/259–262
See application file for complete search history.

(56) References Cited

U.S. PATENT DOCUMENTS

| | | | |
|---|---|---|---|
| 5,666,270 A | 9/1997 | Matsuda et al. | |
| 5,804,882 A | 9/1998 | Tsukagoshi et al. | |
| 6,008,993 A | 12/1999 | Kreft | |
| 6,064,120 A | 5/2000 | Cobbley et al. | |
| 6,161,761 A | 12/2000 | Ghaem et al. | |
| 6,390,375 B2 | 5/2002 | Kayanakis | |
| 6,403,226 B1 | 6/2002 | Biernath et al. | |
| 6,459,588 B1* | 10/2002 | Morizumi | G06K 19/07749 235/492 |
| 6,467,692 B1 | 10/2002 | Tarantino et al. | |
| 6,472,726 B1* | 10/2002 | Hashimoto | H01L 23/4985 257/668 |
| 6,536,674 B2 | 3/2003 | Kayanakis et al. | |
| 6,568,600 B1 | 5/2003 | Carpier | |
| 6,665,193 B1* | 12/2003 | Chung | H01L 24/97 361/760 |
| 6,861,138 B1 | 3/2005 | Pfaff et al. | |
| 6,913,945 B2* | 7/2005 | Yamauchi | H01L 21/563 257/E21.503 |
| 7,524,748 B2 | 4/2009 | Fujimoto et al. | |
| 2002/0050643 A1* | 5/2002 | Takezawa | H01R 4/04 257/746 |
| 2002/0056906 A1* | 5/2002 | Kajiwara | H01L 24/31 257/697 |
| 2002/0189091 A1* | 12/2002 | Ding | H05K 3/462 29/840 |
| 2003/0019568 A1* | 1/2003 | Liu | H05K 3/4614 156/245 |
| 2003/0029559 A1 | 2/2003 | Yamada et al. | |
| 2003/0132302 A1 | 7/2003 | Hattori | |
| 2004/0031855 A1 | 2/2004 | Takahashi | |
| 2004/0169263 A1 | 9/2004 | Fjelstad | |
| 2004/0245648 A1* | 12/2004 | Nagasawa | B22F 1/0059 257/772 |
| 2005/0155706 A1* | 7/2005 | Nishida | H01L 23/295 156/312 |
| 2007/0001313 A1 | 1/2007 | Fujimoto et al. | |
| 2007/0059901 A1* | 3/2007 | Majumdar | H01L 51/0013 438/455 |
| 2008/0051524 A1* | 2/2008 | Ji | C08L 63/00 525/476 |
| 2009/0090494 A1 | 4/2009 | Seidler et al. | |

FOREIGN PATENT DOCUMENTS

| | | |
|---|---|---|
| DE | 19703990 A1 | 8/1998 |
| JP | 2001323246 A | 11/2001 |

OTHER PUBLICATIONS

International Preliminary Report on Patentability for PCT/EP2010/007580, dated Jul. 4, 2012.

Chinese Search Report from corresponding CN Application No. 2010800564714, dated Apr. 27, 2014.

* cited by examiner

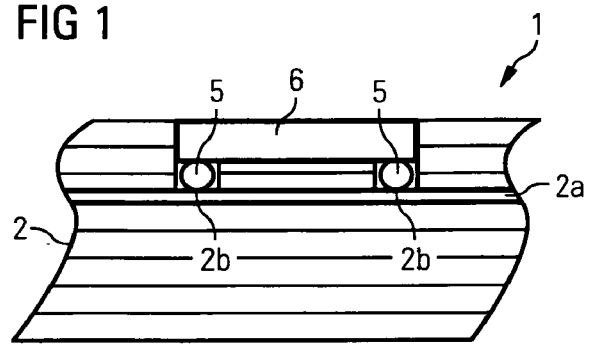
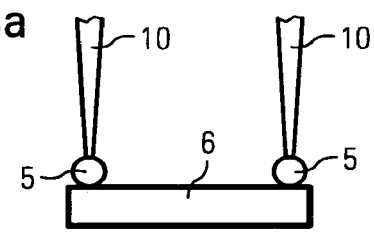
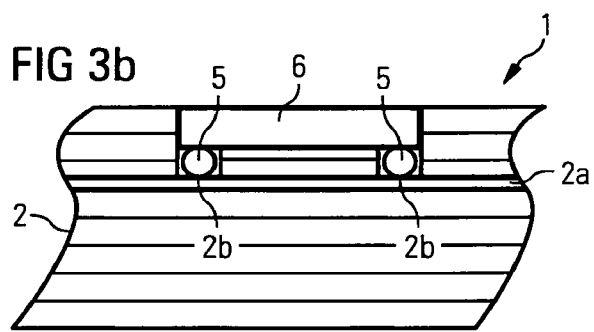
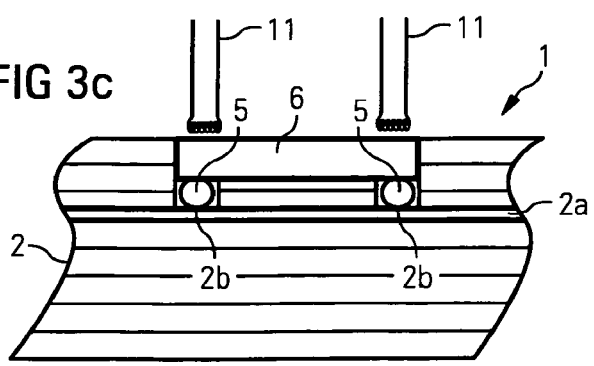

METHOD OF FASTENING AND ELECTROCONDUCTIVE CONNECTING A CHIP MODULE TO A CHIP CARD

BACKGROUND OF THE INVENTION

A. Field of the Invention

The present invention relates to a method for manufacturing a chip card by electroconductively connecting a chip module to a chip-card body, and to such a chip card.

B. Related Art

It is known to electroconductively connect chip modules of chip cards by means of electroconductive silicone to contact areas of a chip-card body. The silicone is for this purpose applied adhesively to any contact areas of the chipcard body and solidifies, thereby producing a silicone elevation, referred to as a flex bump, onto which the chip module is subsequently placed such that there arises an electroconductive connection to the chip module, which connection can flexibly compensate bends and twists of the finished chip card.

However, the silicone loses this flexibility in the course of time, which might also cause the electrical connection to be lost. This is problematic in particular with long lived high-quality chip cards.

A further disadvantage of such connections between chip module and chip-card body is the relatively fast solidification of the silicone, by which its adhesive properties are irrevocably lost, so that the chip module can only be placed contactingly onto the card body and not be applied adhesively. A simultaneous applying of the silicone to the chip-card body and of the chip module to the not yet solidified silicone is impossible for process reasons, on the other hand.

The object of the present invention is hence to establish a lastingly robust, electroconductive connection between chip module and chip-card body.

SUMMARY OF THE DISCLOSURE

A chip card is manufactured by incorporating a chip module into a chip-card body. In chip cards requiring an electro conductive connection between contact areas of the chip-card body and the chip module, e.g. for connecting an antenna integrated into the chip card, a chip module is connected electroconductively to a chip-card body. For this purpose, the chip module, according to the invention, is connected to the chip-card body adhesively by means of a thermoplastic, electroconductive elastomeric material such that the chip module is at the same time electroconductively connected to the at least one electrical contact area of the chip-card body.

Thus, there can respectively be produced for each contact point to be contacted two adhesive connections, namely that between the elastomeric material and the contact area, and that between elastomeric material and the chip module. These adhesive connections as well as the elastomeric material are at the same time electroconductive. In thus manufactured chip cards, the chip module is connected to the chip-card body adhesively by means of the elastomeric material such that the chip module is electroconductively connected to at least one electrical contact area.

Because the elastomeric material is adhesively connected to the chip module as well as to the chip-card body or to its contact areas, a less flexible elastomeric material is sufficient for ensuring a stable electroconductive connection between chip module and contact area. The essential criterion for the lastingness of the electro conductive connection is the strength of the adhesive connection. For this reason, a silicone, in particular a thermoplastic silicone, of average or low flexibility can be employed for a both-sided adhesive connection in order to flexibly compensate mechanical stresses, such as e.g. bends and twists.

Moreover, certain thermoplastic elastomers guarantee a very high flexibility over a wide temperature range and over a long time period, so that a very robust electroconductive connection can be established between the chip module and the chip-card body with thermoplastic, electroconductive elastomers.

Preferably, the chip card is a contactless chip card, i.e. a chip card with a contactless data transfer interface, or a dual interface chip card, i.e. a chip card with a contact-type and contactless data transfer interface, e.g. with an antenna set in the chip-card body. The antenna is then connected to the chip module via the electro conductive, both-sided adhesive elastomeric material.

For adhesively connecting the chip module to the chip-card body, heated and melted elastomeric material can first be applied adhesively at least to one contact area of the chip-card body and solidify at least partly. At an arbitrary later time, the already solidified elastomer can be heated and melted again at least partly and thus be made adhesive, and the chip module can be applied adhesively to the elastomeric material.

According to the invention there is made available a chip-card body in which there is located a depression into which a chip module is inserted. In the depression there is located at least one contact area in order to establish an electroconductive connection to a corresponding contact area of the chip module, whereby the chip module has at least one contact area. For this purpose, the elastomeric material is first heated and melted to a temperature at which it can enter into an adhesive connection with the contact areas of the chip-card body, and is then applied to the relevant contact areas. The elastomeric material then quickly cools and thereby solidifies at least partly. Subsequently, the chip module is so inserted that the elastomeric material touches contact areas of the chip module. To be able to enter into a further adhesive connection with the contact areas of the chip module, the elastomeric material is heated and melted again up to a suitable temperature through the chip-card body and/or the chip module, at least at those places on the surface where an adhesive connection to the contact areas of the chip module is to be established, so that a further adhesive connection is formed between the elastomeric material and the contact areas of the chip module. Thus, an electroconductive connection is established between the contact areas of the chip module and the contact areas of the chip-card body.

In a modified method, the heated and melted elastomeric material is first applied to the chip module and solidifies there at least partly. After the chip module has been inserted into the chip-card body, the elastomer is partly heated and melted again through the chip module and/or the chipcard body in order to establish a further adhesive connection with the contact areas of the chip-card body.

The elastomeric material is thus first heated and melted to a temperature at which it can enter into an adhesive connection with the chip module, and then applied to the chip module, where it quickly cools and solidifies. After the chip module has been inserted into the chip-card body, the elastomeric material is, at an almost arbitrary later time, heated and melted again to a suitable temperature through the chip module and/or the chip-card body, at least at those places on the surface where it is to enter into an adhesive connection with the chip-card body, in order to establish a further adhesive connection to the contact areas of the chip-card body. There thus arises an electro conductive connection between the chip module and the contact area of the chip-card body via the electro conductive elastomeric material.

The elastomeric material is preferably applied adhesively with a conventional metering unit for hot-melt adhesives ("hot melts") or an injection molding machine.

Alternatively, the elastomeric material can also be made available in the form of a foil. The latter is preferably heated and melted to a temperature that is suitable for forming a corresponding adhesive connection, and then first applied adhesively to the contact areas of the chip-card body or to the contact areas of the chip module. After solidification of the elastomeric material, the chip module is then inserted into the chip-card body, and a further adhesive connection to the contacts of the chip module or of the chip-card body is established by repeated heating and melting of the elastomeric material through the chip-card body and/or the chip module.

As a thermoplastic, electro conductive elastomeric material there comes into consideration in particular an elastomeric material with electroconductive filler. Particularly preferably there is employed a thermoplastic silicone, in particular a silicone of the type GENIOMER© from Wacker ChemieAG, to which an electroconductive filler is preferably added.

The elastomeric material provides the necessary adhesion, is sufficiently stable and long-lived and possesses a relatively uniform elasticity over a wide temperature range and a long life. In contrast to some classic thermoplastic elastomers based on styrene or polyolefin, which have a restricted elasticity over a wide temperature range or solidify at excessively low temperatures, an elastomeric material of the GENIOMER© type possesses a wide temperature range and a very good elasticity in particular also at low temperatures.

Particularly preferably, there is employed an elastomeric material that can enter into an adhesive connection with the chip module and/or the chip-card body, upon adhesive connecting of the chip module on the chip-card body, at temperatures that lie below a maximum temperature load on the chip module and/or the chip-card body. This avoids damaging of the chip module or the chip-card body by the new heating and adhesive applying of the heated and melted elastomeric material.

Likewise preferably, there is employed an elastomeric material wherein the mechanical loading capacity of the adhesive connection between the chip module and the chip-card body is optimized. In particular, there can be employed an elastomeric material to which one or several suitable additives are admixed.

For improving the adhesion, an adhesion promoter, so-called primer, can be applied on the surface of the contacts of chip module and/or chip-card body.

DESCRIPTION OF THE DRAWINGS

Further features and advantages of the invention will result from the following description of the embodiment examples of the invention as well as further alternative embodiments in connection with the drawings, which show:

a.
FIG. 1 a chip card according to the invention;
b.
FIGS. 3a-3c steps of an alternative method sequence for manufacturing the chip card according to FIG. 1.

DETAILED DESCRIPTION OF PREFERRED EMBODIMENTS

Figure 2A:
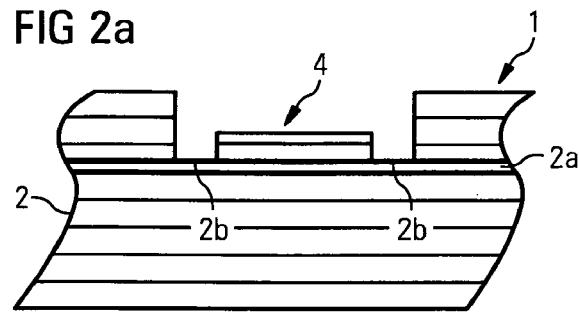
FIGS. 2a-2d steps of a method sequence for manufacturing the chip card according to FIG. 1; and
c.

While FIGS. 2 and 3 illustrate two alternative methods for manufacturing a chip card 1, FIG. 1 shows schematically such a chip card 1 with a chip module 6 which is connected adhesively to the chip-card body 2 by means of a thermoplastic, electro conductive elastomeric materials, whereby the chip module 6 is conductively connected by the elastomeric materials at the same time to the electrical contact areas 2b of the chip-card body 2.

The chip-card body 2 of the chip card 1 is constructed according to FIG. 1 from different layers indicated by parallel lines. In the chip-card body 2 there is incorporated an antenna layer 2a, which can be realized e.g. as an imprinted coil, i.e. as an electroconductive imprint in the form of a coil serving as an antenna, or the like. Furthermore, the chip-card body 2 possesses a recess 4 (cf. FIGS. 2a to 2c) into which the chip module 6 is inserted. Below the chip module 6 there are located within the recess 4 two flex-bump structures 5 made of a thermoplastic, electroconductive silicone. The flex bumps 5 are connected adhesively and at the same time electroconductively to contact areas 2b of the coil layer 2a of the chip-card body 2 and the chip module 6, and thereby simultaneously ensure an adhesive and an electroconductive connection between these two components 2b, 6.

In the embodiment example of FIG. 1, the contact areas 2b of the coil layer 2a represent the accessible places of the coil layer 2a which are formed in the chip-card body 2 by deeper recesses at various points. Alternatively, the contact areas 2b can also be specially configured, e.g. be provided with an especially highly electroconductive coating, or the like. Quite generally, the contact areas 2b, as contact areas of the chip-card body 2, need not be connected electroconductively to a coil layer 2a, but can be connected electroconductively to arbitrary electrical components of the chip-card body 2, e.g. to a current source. Moreover, the flex bumps 5 can be connected adhesively not only to the contact areas 2b but also to further places of the chip-card body 2 in order to produce an especially robust adhesive connection. In this case, the contact area 2b forms only a part of the area with which the flex bump 5 is adhesively connected to the chip-card body 2.

To activate the coil layer 2a or, in the general case, the corresponding electrical component of the chip-card body 2, the chip module 6 likewise possesses contact areas (not represented) which are connected by the flex bumps 5 suitably to the coil layer 2a or, in the general case, to the corresponding electrical component of the chip-card body 2.

The chip-card body 2 of the chip card 1 is particularly preferably configured in a format according to ISO 7816. Particularly preferably, the chip card 1 is a chip card 1 with a contactless interface, e.g. a dual interface chip card with a contactless and contact-type interface for data transfer.

FIG. 2 illustrates a preferred method sequence for manufacturing the chip card 1 of FIG. 1. There is first made available here in FIG. 2a a suitable chip-card body 2 which is of multilayer construction and comprises an antenna layer 2a. In the chip-card body 2 there is provided a recess 4 for insertion of a chip module 6, whereby via the recess 4 the contact areas 2b of the antenna layer 2a are accessible through deeper recesses at various points.

Figure 2B:
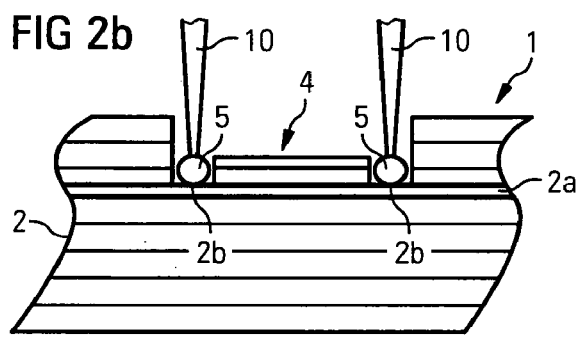
Figure 2C:
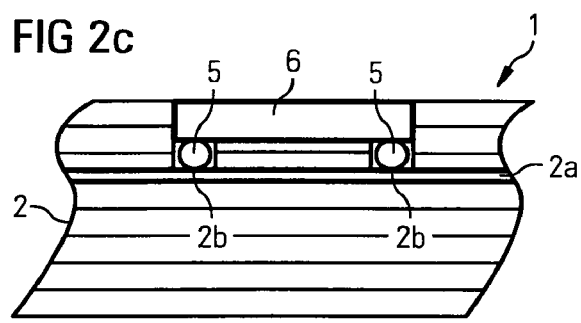

FIG. 2b shows how the heated and melted elastomeric materials is applied to the contact area 2b by means of the application tool 10 after being previously heated and melted to a temperature at which it can enter into a conductive connection with the contact areas 2b. In so doing, the elastomeric materials are suitably metered and applied in a sufficiently precisely defined form in order to avoid e.g. short circuits. Quite generally, there can be employed for applying the elastomeric materials, inter alia, a conventional metering unit for hot-melt adhesives or an injection molding machine Alternatively, the elastomeric materials can also be made available in the form of a foil, heated and melted and then applied. Through the applying of the heated and melted elastomeric materials there arises an adhesive connection of the elastomeric materials to the contact area 2b.

Figure 2D:
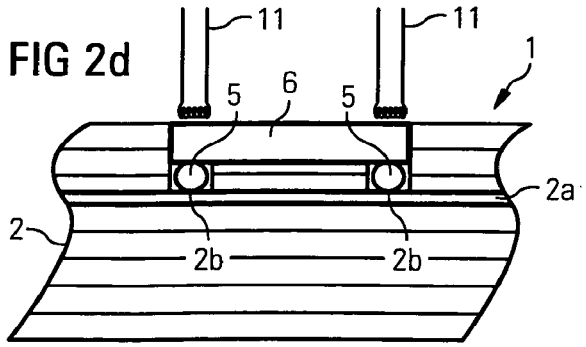

Subsequently, the applied elastomeric material 5 cools and solidifies at least partly, so that it cannot enter into any further adhesive connection. Subsequently, the chip module 6 is incorporated into the recess 4 such that the electroconductive elastomeric materials lies opposite the chip module 6 in the form of flex bumps, see FIG. 2e. To establish a further adhesive connection to the chip module 6, the applied elastomeric materials is, in FIG. 2d, heated and melted again through the chip module 6 with a heating tool 11 at an almost arbitrary later time. Alternatively, the elastomeric material can also be heated and melted through the chip-card body 2. In so doing, it is heated and melted to a temperature at which it can enter into a further adhesive connection with the chip module 6, on the one hand, and does not damage the chip-card body 2 or the chip module 6, on the other hand. It is sufficient here if the elastomeric materials are heated and melted to this temperature on the surface that is to enter into a further adhesive connection with the chip module 6. Simultaneously with the establishment of an adhesive connection, an electroconductive connection is established between the chip module 6 and the contact areas 2b. The finished chip card 1 with the inserted as well as adhesively and conductively connected chip module 6 is shown in FIG. 2d and corresponds to the chip card 1 represented in FIG. 1.

FIG. 3 shows an alternative method for manufacturing the chip card 1 represented in FIG. 1. This method differs from the method represented in FIG. 2 in that the heated and melted elastomeric materials is not applied with the application tool 10 to the contact areas 2b of the chip-card body 2, as in FIG. 2b, but to the chip module 6, as represented in FIG. 3a. The metering and shaping of the elastomeric material can be affected as described in connection with FIG. 2b. In analogy to the method step described in FIG. 2b, the elastomeric material can also alternatively be made available in the form of a foil, heated and melted and then applied. The temperature of the heated and melted elastomeric materials is chosen such that it enters into an adhesive connection with the chip module 6 and does not damage the chip module 6.

Subsequently, in FIG. 3b, the chip module 6 with the elastomeric materials in the form of flex bumps is inserted into the chip-card body 2, so that the flex bumps 5 and the contact areas 2b of the coil layer 2a oppose each other. In FIG. 3e, in analogy to the method step represented in FIG. 2e, the cooled and at least partly solidified elastomeric material is heated and melted again through the chip module 6 to a suitable temperature, in order that it can enter into an adhesive connection with the contact areas 2b of the chip-card body 2. Alternatively, the elastomeric material can also be heated and melted through the chip-card body 2. This causes, in analogy to the method represented in FIG. 2, an electroconductive connection to be established between the chip module 6 and the contact areas 2b at the same time. The chip card 1 produced by this alternative method is represented in FIG. 3e and corresponds to the chip card 1 represented in FIG. 2d and FIG. 1.

In both methods there is employed an elastomeric materials that can enter into an adhesive connection with the chip module 6 and/or the chip-card body 2 at temperatures that lie below a maximum temperature load on the chip module 6 and/or the chip-card body 2. Because the maximum temperature load is normally not the same for the total chip module 6 or the total chip-card body 2, not the total chip module 6 or the total chip-card body 2 needs to be able to withstand the temperature of the heated and melted elastomeric materials, but preferably only those parts that come into contact with the heated elastomeric materials or lie in the proximity thereof. A chip protected by the housing of the chip module 6 must for example only withstand an accordingly lower temperature load, which depends on different parameters, such as e.g. the amount of applied heated and melted elastomeric materials. To ensure that the elastomeric material 5 can enter into an adhesive connection with the chip module 6 and/or the chip-card body 2 at temperatures that lie below a maximum temperature load on the chip module 6 and/or the chip-card body 2, one can optimize the elastomeric materials in its composition, as well as the components and the construction of the chip module 6 and/or of the chip-card body 2, as well as further parameters, such as e.g. by suitable additives or the like.

As an application tool 10 there can be used for both methods a conventional metering unit for hot-melt adhesives ("hot melts") or an injection molding machine If such a metering unit for hot-melt adhesives is employed, one must make sure that the heated and melted elastomeric materials to be applied has a sufficient homogeneity in order for it to be processable without defects. As an injection molding machine there is preferably employed a machine that works in the vertical direction, i.e. that applies the elastomeric material 5 in the vertical direction (in particular from above).

As a thermoplastic, electro conductive elastomeric materials there comes into consideration in both methods in particular an elastomeric materials with electroconductive filler. Particularly preferably, there is employed a thermoplastic silicone, in particular a silicone of the type GENIOMER© from Wacker ChemieAG, to which an electro conductive filler is preferably added.

The strength of the adhesive connection of the elastomeric materials to the chip module 6 and the chip-card body 2 can be optimized in both methods, in particular by optimizing the elastomeric materials. In particular, there can be employed an elastomeric materials to which one or several suitable additives are admixed and/or on whose surface an adhesion promoter is applied. Likewise, the condition of the corresponding surfaces of the chip module 6 and of the chipcard body 2 (in particular of the contact areas 2b of the chip-card body 2) can be optimized, for example again by a corresponding additive and/or by applying an adhesion promoter.

In both methods, the chip-card bodies 2 are preferably automatically supplied with the application tool 10 and/or the heating tool 11 and/or further tools or machines, and withdrawn therefrom, either in line, i.e. e.g. by assembly line, or also individually, i.e. e.g. by means of a robot.

The method of the invention is suitable not only for adhesive connecting with simultaneous electroconductive contacting of a chip-card module 6 to a chip-card body 2, but also for adhesive connecting with simultaneous electro conductive contacting of other components, in particular arbitrary portable data carriers with chip modules and/or other components.

The invention claimed is:

1. A method for manufacturing a chip card by electroconductive connecting of a chip module to a chip-card body having at least one electrical contact area, the method comprising the step:

adhesively connecting the chip module to the chip-card body by an elastomeric material such that the chip module is conductively connected to at least one electrical contact area of the chip-card body, the elastomeric material being a thermoplastic, electroconductive elastomeric material, wherein the step of adhesively connecting of the chip module to the chip-card body includes:

heating and melting the elastomeric material, and adhesively applying the heated and melted elastomeric material at least to the at least one electrical contact area of the chip-card body or to the chip module, and at least partially solidifying the elastomeric material; applying the chip module to the at least partly solidified elastomeric material on the chip-card body or the chip-card body to the at least partly solidified elastomeric material on the chip module; and heating and melting again the elastomeric material through at least one of the chip-card body or the chip module such that a further adhesive connection is formed between the elastomeric material and the contact areas of the chip module or the elastomeric material and the contact areas of the chip-card body, and an electroconductive connection is established between the contact areas of the chip module and the contact areas of the chip-card body, wherein the chip card body includes an antenna, and the method further comprises connecting the chip module electroconductively to at least one electrical contact area of the antenna in the chip-card body.

2. The method according to claim 1, wherein the step of adhesively connecting of the chip module to the chip-card body includes:

adhesively applying the heated and melted elastomeric material at least to the at least one electrical contact area of the chip-card body and at least partially solidifying the elastomeric material;

applying the chip module to the at least partly solidified elastomeric material on the chip-card body; and wherein said heating and melting again of the elastomeric material through at least one of the chip-card body and the chip module forms the further adhesive connection between the elastomeric material and the contact areas of the chip module and the electroconductive connection is established between the contact areas of the chip module and the contact areas of the chip-card body.

3. The method according to claim 1, wherein the steps of the adhesively connecting of the chip module to the chip-card body comprises:

adhesively applying the heated and melted elastomeric material to the chip module and at least partially solidifying the elastomeric material, applying the chip-card body to the at least partly solidified elastomeric material on the chip module, and wherein said heating and melting again of the elastomeric material through at least one of the chip-card body and the chip module forms the further adhesive connection between the elastomeric material and the contact areas of the chip-card body and the electroconductive connection is established between the contact areas of the chip module and the contact areas of the chip-card body.

4. The method according to claim 1, wherein the chip card comprises a contactless communication interface and the chip card is configurable as a dual interface chip card.

5. The method according to claim 1, wherein the chip card comprises said antenna incorporated into the chip-card body, said antenna being connected to the chip module electroconductively with the at least one electrical contact area.

6. The method according to claim 1, wherein the thermoplastic, electroconductive elastomeric material further includes a conductive filler.

7. The method according to claim 1, wherein the thermoplastic, electroconductive elastomeric material includes a copolymer of polydimethylsiloxane and urea.

8. The method according to claim 1, wherein the chip module and the chip-card body each have a maximum temperature, the maximum temperature of the chip module being the temperature at and above which the chip module becomes damaged and the maximum temperature of the chip-card body being the temperature at and above which the chip-card body becomes damaged, and the thermoplastic, electroconductive elastomeric material enters into an adhesive connection with the chip module or the chip-card body at a temperature below the maximum temperature of the chip module or the maximum temperature of the chip-card body.

9. The method according to claim 1, wherein the thermoplastic, electroconductive elastomeric material is provided between the at least one electrical contact area of the chip-card body and a corresponding electrical contact area of the chip module.

10. The method according to claim 2, wherein the elastomeric material is adhesively applied with a conventional metering unit for hot-melt adhesives.

11. The method according to claim 2, wherein the elastomeric material is adhesively applied with an injection molding machine.

12. The method according to claim 2, wherein the elastomeric material is adhesively applied in the form of a foil.

13. The method according to claim 2, including adhesively applying an elastomeric material with a conductive filler.

14. The method according to claim 2, including adhesively applying an elastomeric material that, upon adhesive connecting of the chip module to the chip-card body, enters into an adhesive connection with at least one of the chip module and the chip-card body at temperatures that lie below a maximum temperature load on either or both the chip module and the chip-card body.

15. The method according to claim 2, including adhesively applying an elastomeric material and optimizing the strength of the adhesive connection between the chip module and the chip-card body.

16. The method according to claim 13, wherein, as an elastomeric material, there is adhesively applied a thermoplastic silicone.

17. The method according to claim 15, wherein there is adhesively applied an elastomeric material to which an additive is admixed.

18. The method according to claim 15, wherein there is adhesively applied an elastomeric material to which an adhesion promoter is applied.

19. A method for manufacturing a chip card by electroconductive connecting of a chip module to a chip-card body having at least one electrical contact area, the method comprising:
   adhesively connecting the chip module to the chip-card body by an elastomeric material such that the chip module is conductively connected to at least one electrical contact area of the chip-card body, the elastomeric material being a thermoplastic, electroconductive elastomeric material,
   wherein the adhesively connecting of the chip module to the chip-card body includes:
      heating and melting the elastomeric material, and adhesively applying the heated and melted elastomeric material to the at least one electrical contact area of the chip-card body or to the chip module;
      at least partially solidifying the elastomeric material;
      heating and melting again the elastomeric material; and
      establishing, after the heating and melting again of the elastomeric material, an electroconductive connection between the contact areas of the chip module and the contact areas of the chip-card body,
   wherein the chip card body includes an antenna, and the method further comprises connecting the chip module electroconductively to at least one electrical contact area of the antenna in the chip-card body.

* * * * *